(12) United States Patent
Jeon et al.

(10) Patent No.: US 7,456,468 B2
(45) Date of Patent: Nov. 25, 2008

(54) SEMICONDUCTOR DEVICE INCLUDING HIGH-K INSULATING LAYER AND METHOD OF MANUFACTURING THE SAME

(75) Inventors: Sang-Hun Jeon, Seoul (KR); Sung-Kyu Choi, Gyeonggi-do (KR); Chung-Woo Kim, Gyeonggi-do (KR); Hyun-Sang Hwang, Gwangju-si (KR); Sung-Ho Park, Gyeonggi-do (KR); Jeong-Hee Han, Gyeonggi-do (KR); Sang-Moo Choi, Gwangju-si (KR)

(73) Assignee: Samsung Electronics, Co., Ltd., Suwon-si, Gyeonggi-do (KR)

( * ) Notice: Subject to any disclaimer, the term of this patent is extended or adjusted under 35 U.S.C. 154(b) by 127 days.

(21) Appl. No.: 11/335,431

(22) Filed: Jan. 18, 2006

(65) Prior Publication Data
US 2006/0157754 A1    Jul. 20, 2006

(30) Foreign Application Priority Data
Jan. 18, 2005    (KR)    ........................ 10-2005-0004455

(51) Int. Cl.
*H01L 29/792* (2006.01)
(52) U.S. Cl. .................. 257/324; 257/410; 257/411; 257/761; 257/765; 257/E21.679
(58) Field of Classification Search ............ 257/324
See application file for complete search history.

(56) References Cited

U.S. PATENT DOCUMENTS 6,441,417 B1    8/2002    Zhang et al.

| 2003/0209816 | A1 | 11/2003 | Yamaguchi et al. |
| 2005/0139937 | A1* | 6/2005 | Kamiyama et al. ........... 257/410 |
| 2005/0263803 | A1* | 12/2005 | Takayanagi ................. 257/288 |
| 2006/0131672 | A1* | 6/2006 | Wang et al. ................. 257/410 |
| 2006/0261401 | A1* | 11/2006 | Bhattacharyya ............. 257/316 |

FOREIGN PATENT DOCUMENTS

| CN | 1108613 C | 5/2003 |
| JP | 2002-134739 | 5/2002 |
| JP | 2004158810 A * | 6/2004 |
| KR | 2003-0024897 | 3/2003 |
| KR | 2004-0002818 | 1/2004 |
| KR | 2004-0023528 | 3/2004 |
| KR | 2004-0064965 | 7/2004 |

OTHER PUBLICATIONS

English language abstract of Korean Publication No. 2004-0002818.
English language abstract of Korean Publication No. 2004-0023528.
English language abstract of Korean Publication No. 2004-0064965.

* cited by examiner

*Primary Examiner*—Jerome Jackson
*Assistant Examiner*—Jose R Diaz
(74) *Attorney, Agent, or Firm*—Marger Johnson & McCollom, P.C.

(57) ABSTRACT

A semiconductor memory device a first dopant area and a second dopant area, the first dopant area and the second dopant area disposed in a semiconductor substrate, an insulating layer disposed in contact with the first dopant area and the second dopant area, the insulating layer including a material selected from the group consisting of Hf, Zr, Y, and Ln, and a gate electrode layer disposed on the insulating layer.

7 Claims, 9 Drawing Sheets

SEMICONDUCTOR DEVICE INCLUDING HIGH-K INSULATING LAYER AND METHOD OF MANUFACTURING THE SAME

CROSS-REFERENCE TO RELATED APPLICATIONS

This application claims priority from Korean Patent Application No. 10-2005-0004455 filed on 18 Jan. 2005 in the Korean Intellectual Property Office. Korean Patent Application No. 10-2005-0004455 is hereby incorporated by reference in its entirety.

BACKGROUND

1. Technical Field

This disclosure relates to a semiconductor memory device including a high dielectric constant (high-k) insulating layer and a method of manufacturing the same.

2. Description of the Related Art

Semiconductor memory devices are developed with a focus on increasing information storage capacity and the speeds at which information is recorded and erased. Such a semiconductor memory device includes a large number of unit memory cells circuitally connected to one another.

Each unit cell of a semiconductor memory device such as a dynamic random access memory (DRAM) DRAM includes a transistor and a capacitor. The DRAM is a volatile memory device that can quickly process accesses but has a short retention time for a stored signal.

A representative example of a volatile memory device is a flash memory. Various other types of volatile memory devices such as silicon-nitride-oxide semiconductor (SNOS) memory devices, MRAMs, PRAMs, and the like have been developed. Flash memory devices, SNOS memory devices, and floating gate type memory devices commonly use materials having high dielectric constants (high-k).

FIGS. 1A and 1B are sectional diagrams illustrating a process of manufacturing a conventional SNOS memory device having a high-k. Referring to FIG. 1A, a tunneling oxide layer 13, a charge-trap layer 14, a blocking oxide layer 15, and a gate electrode layer 16 are sequentially formed on a semiconductor substrate 11. The tunneling oxide layer 13 may be formed of $SiO_2$ to a thickness of about 30 Å, the charge-trap layer 14 may be formed of $HfO_2$, and the blocking oxide layer 15 may be formed of $Al_2O_3$ to a thickness of 100 Å.

Next, both sides of each of the tunneling oxide layer 13, the charge-trap layer 14, the blocking oxide layer 15, and the gate electrode layer 16 are removed to form a gate. As a result, upper surfaces of the semiconductor substrate 11 are exposed on both sides of the gate.

Referring to FIG. 1B, the upper surfaces of the semiconductor substrate 11 to both sides of the gate are doped with a dopant, for example, boron (B) or phosphorous (P), using an ion implantation method. Here, the dopant is selected depending on a doping type of the semiconductor substrate 11. In other words, if the semiconductor substrate 11 is an n-type substrate, first and second dopant areas 12a and 12b are implanted with a material belonging to Group III so as to be doped with a p-type dopant. If the semiconductor substrate 11 is a p-type substrate, the first and second dopant areas 12a and 12b are implanted with a material belonging to Group V so as to be doped with an n-type dopant.

After the semiconductor substrate 11 is implanted with the dopant as shown in FIG. 1B, an annealing process is performed to activate the first and second dopant areas 12a and 12b as shown in FIG. 1C. For this purpose, the first and second dopant areas 12a and 12b are heated at a high temperature between about 900° C. and 1000° C. The first and second dopant areas 12a and 12b are crystallized by this high temperature annealing process, becoming first and second dopant areas 12a' and 12b'.

However, the high temperature annealing process described above may also cause a high-k material that is generally used in a gate structure of a semiconductor memory device to become crystallized. In general, in a case where the high-k material is amorphous in an initial deposition state, the high-k material must be insulated from the gate electrode layer 16 during an operation of the semiconductor memory device. However, in a case where a material for the blocking oxide layer 15 is crystallized by the high temperature annealing process, a leakage current may be generated through a grain boundary area and may have an adverse influence on the characteristics of the semiconductor memory device.

For example, FIGS. 2A and 2B illustrate characteristics of the memory devices shown in FIGS. 1A-1C that are manufactured with the high temperature annealing process described above.

FIG. 2A illustrates current-voltage (I-V) characteristics of conventional semiconductor memory devices that are annealed at temperatures of 700° C., 800° C., and 900° C. under an oxygen atmosphere. Referring to FIG. 2A, as a voltage approaches 0V, an intensity of a current is gradually reduced. However, the intensity of the current still approaches a value that is greater than zero. In particular, when the semiconductor memory device is annealed at a higher temperature of 900° C., the intensity of the current has a greater value.

FIG. 2B is a graph illustrating an X-ray diffraction (XRD) measured after the semiconductor memory device manufactured according to the process described with reference to FIGS. 1A and 1B is annealed at temperatures of 700° C., 800° C., 900° C., 950° C., and 1000° C. Referring to FIG. 2B, it can be seen that as an annealing temperature is increased, an $Al_2O_3$ peak becomes prominent at about 68°. This peak indicates that crystallization has occurred. In other words, as the annealing temperature increases, crystallization easily occurs.

FIG. 2C is a graph illustrating a retention characteristic of the semiconductor memory device manufactured according to the process described with reference to FIGS. 1A and 1B with respect to the annealing temperature. The semiconductor memory device has a high retention value less than or equal to "0.2" at the annealing temperature of 800° C. or less but a low retention value at the annealing temperature of 900° C.

Accordingly, it can be seen that the crystallization of a high-k material caused by a high temperature annealing process has an adverse influence on the characteristics of conventional semiconductor memory devices.

Embodiments of the invention address these and other disadvantages of the conventional art.

SUMMARY

The present invention provides a semiconductor memory device including a high-k material such as a Hafnium (Hf) silicate, a Zirconium (Zr) silicate, a Yttrium (Y) silicate, or a lanthanum-family metal silicate so as to be thermally stable even in a high temperature annealing process for activating first and second dopant areas and a method of manufacturing the semiconductor memory device.

BRIEF DESCRIPTION OF THE DRAWINGS

The above and other features and advantages of the invention will become more apparent by describing in detail exemplary embodiments thereof with reference to the following drawings.

DETAILED DESCRIPTION

Figure 1A:
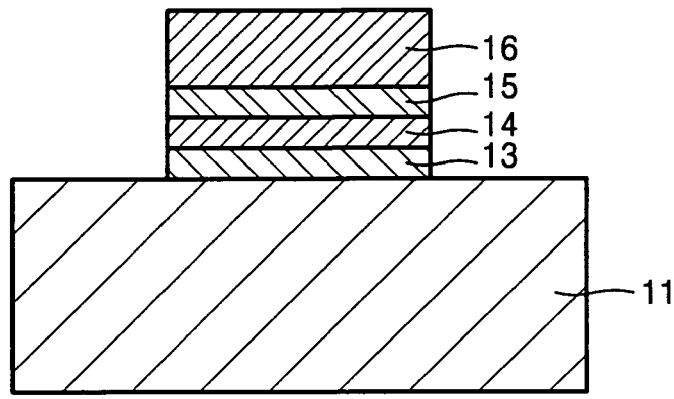
FIGS. 1A through 1C are sectional diagrams illustrating a conventional method of manufacturing a SNOS semiconductor memory device.
Figure 1B:
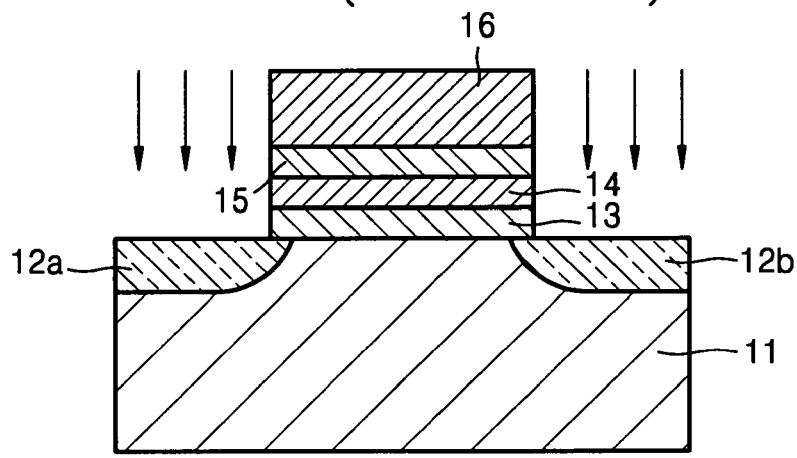
Figure 1C:
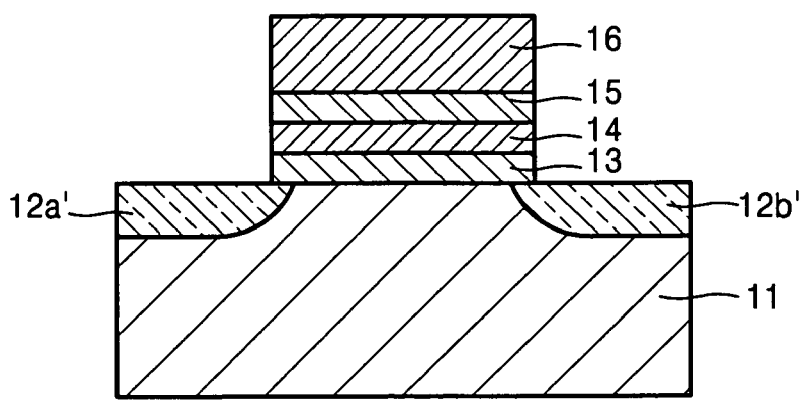
Figure 2A:
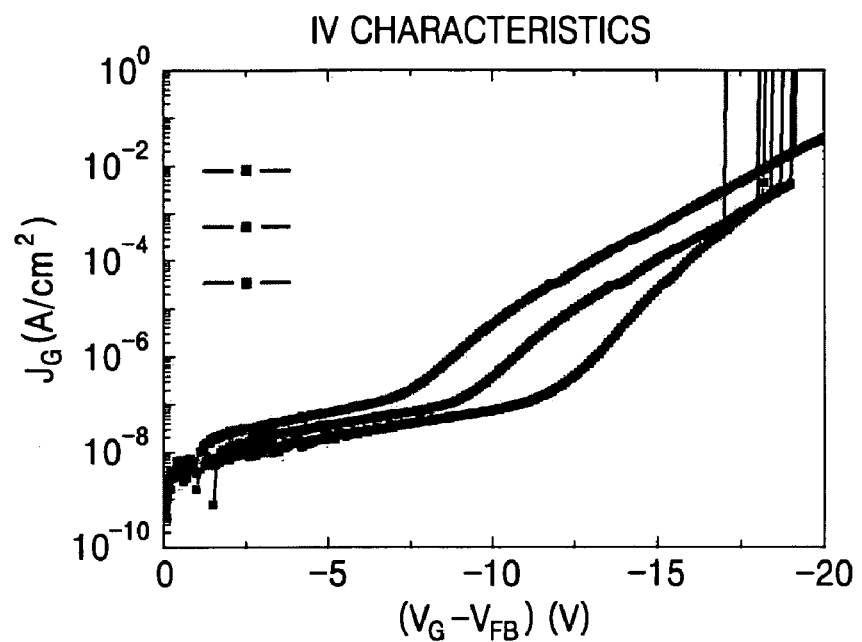
FIG. 2A is a graph illustrating electrical characteristics of the semiconductor memory device of FIGS. 1A-1C.
Figure 2B:
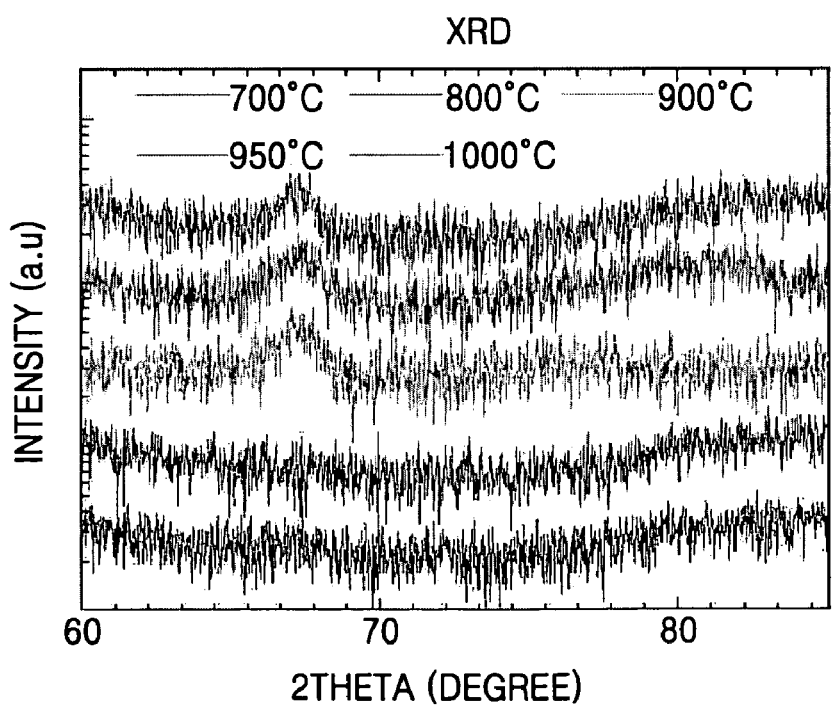
FIG. 2B is a graph illustrating an XRD of the semiconductor memory device of FIGS. 1A-1C.
Figure 2C:
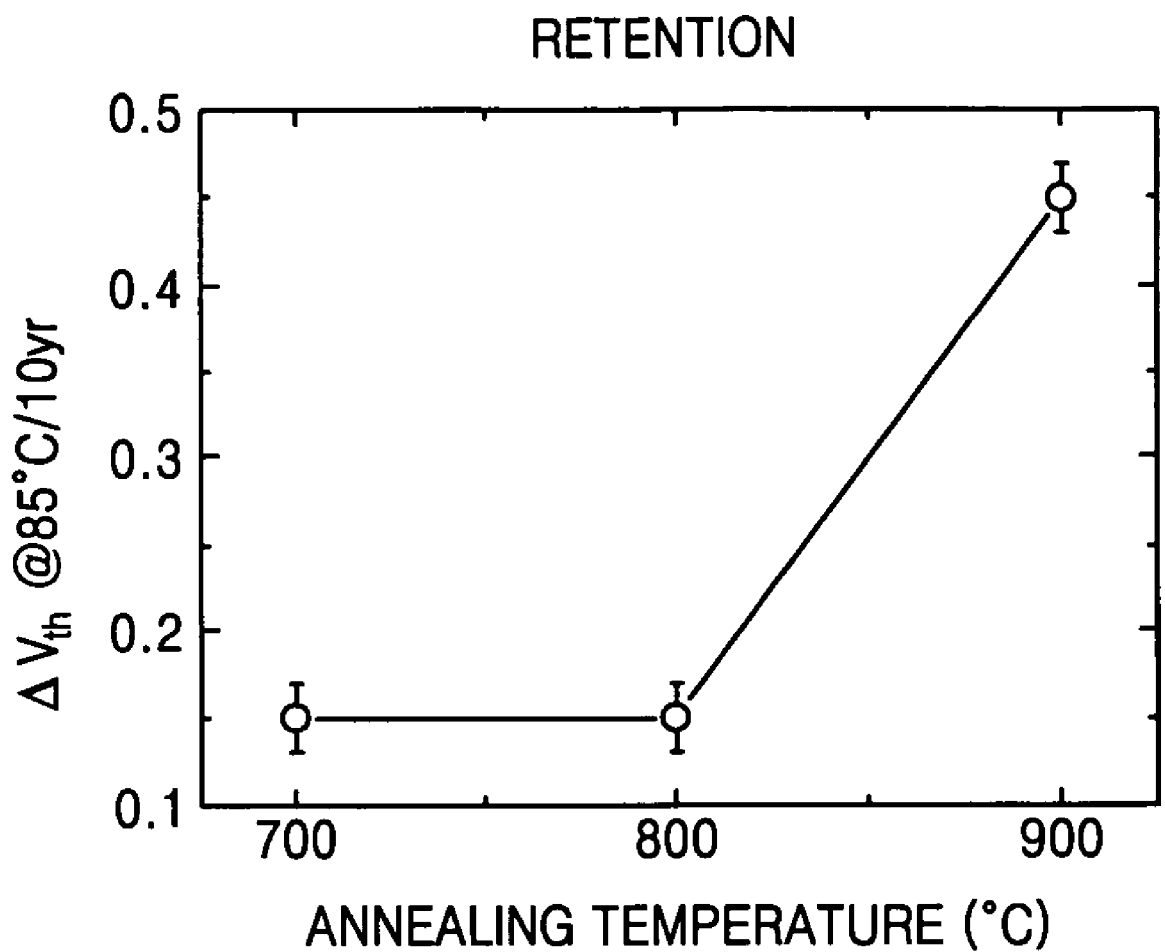
FIG. 2C is a graph illustrating a retention characteristic of the semiconductor memory device shown in FIGS. 1A through 1C with respect to an annealing temperature.

A semiconductor memory device including a high-k insulating layer and a method of manufacturing the semiconductor memory device according to some embodiments of the invention are described below with reference to the attached drawings.

FIGS. 3A through 3D are sectional diagrams illustrating a method of manufacturing a semiconductor memory device including a high-k insulating layer according to some embodiments of the invention. In the drawings, the thicknesses of layers and regions are exaggerated for clarity. In the illustrated embodiments, a SONOS memory device is described as an example. However, it will be apparent that the inventive principles contained in the illustrated embodiments may be applied to other memory devices including high-k materials such as flash memory devices, floating gate type memories, or the like.

Figure 3A:
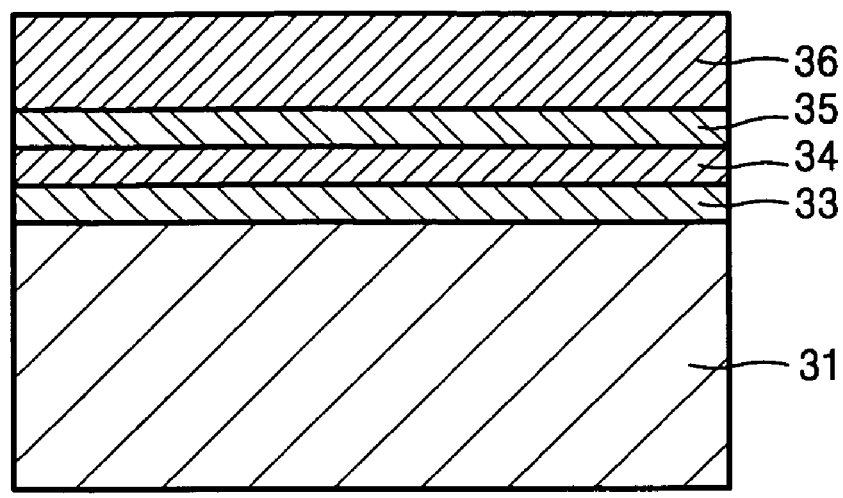
FIGS. 3A through 3D are sectional diagrams illustrating a method of manufacturing a semiconductor memory device including a high-k insulating layer according to some embodiments of the invention.

Referring to FIG. 3A, a first oxide layer 33, a charge-trap layer 34, a second oxide layer 35, and a gate electrode layer 36 are sequentially formed on a semiconductor substrate 31. In general, the first oxide layer 33, the charge-trap layer 34, and the second oxide layer 35 are formed of dielectric materials and have the characteristics of an insulator. Here, in a case of the SONOS memory device, the first oxide layer 33 may be referred to as a tunneling oxide layer, and the second oxide layer 35 may be referred to as a blocking oxide layer.

According to embodiments of the invention, the dielectric layers include a high-k dielectric material. The high-k dielectric material may include one or more of a Hafnium (Hf) silicate, a Zirconium (Zr) silicate, a Yttrium (Y) silicate, or a lanthanum-family metal (Ln) silicate, where Ln is generally used to refer to any one of the fifteen elements in the lanthanide series of metals (La, Ce, Pr, Nd, Pm, Sm, Eu, Gd, Th, Dy, Ho, Er, Tm, Yb, or Lu).

Specifically, the high-k dielectric material includes $((Hf, Zr, Y \text{ or } Ln)O_2)_x(SiO_2)_{1-x}$, where x is within a range between 0.03 and 0.26 ($0.03 \leq x \leq 0.26$). In other words, an amount of Hf, Zr, Y, or La added to a silicate may be selectively adjusted within a range between 3 atomic % and 26 atomic %. Thus, as will be described in further detail below, the semiconductor memory device may be thermally stable in a high temperature annealing process during a process of manufacturing the semiconductor memory device. In some embodiments, a material such as aluminum (Al) or Nitrogen (N) may be added to $((Hf, Zr, Y \text{ or } Ln)O_2)_x(SiO_2)_{1-x}$ to secure thermal stability.

In alternative embodiments, Al may be used instead of silicon (Si) for the high-k dielectric material. In this case, the chemical formula for the high-k dielectric material is $((Hf, Zr, Y \text{ or } Ln)O_2)_x(Al_2O_3)_{1-x}$, where ($0.03 \leq x \leq 0.26$).

Figure 3B:
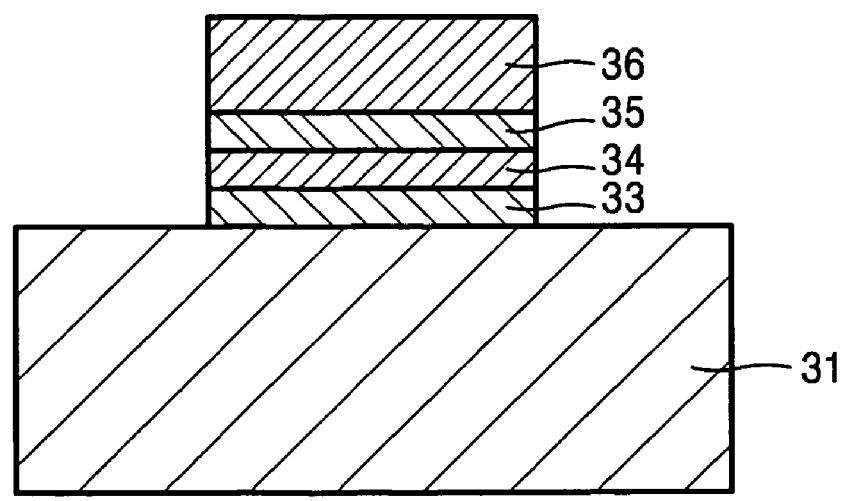

Referring to FIG. 3B, both sides of each of the tunneling oxide layer 33, the charge-trap layer 34, the blocking oxide layer 35, and the gate electrode layer 36 are sequentially etched to define a gate area of a predetermined width. As a result, upper surfaces of the semiconductor substrate 31 to both sides of the gate area are exposed. The resultant structure shown in FIGS. 3A and 3B may be easily manufactured by a generally known semiconductor process.

Figure 3C:
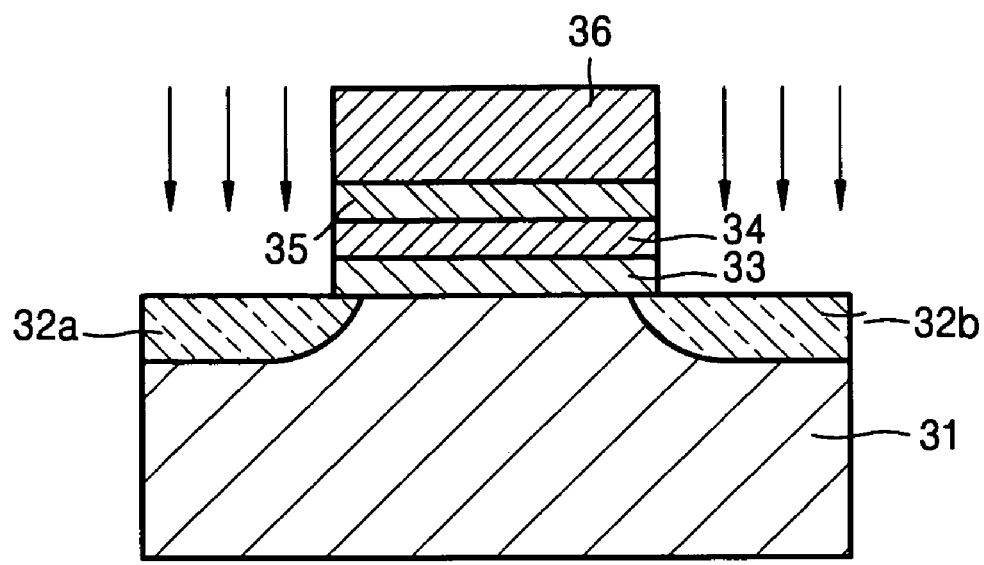

Referring to FIG. 3C, the exposed upper surfaces of the semiconductor substrate 31 are doped with a dopant using an ion implantation process or the like. Here, the dopant may be selectively used depending on a doping state of the semiconductor substrate 31. If the semiconductor substrate 31 is a p-type substrate, the upper surfaces of the semiconductor substrate 31 may be doped with a material belonging to Group V to form first and second dopant areas 32a and 32b. If the semiconductor substrate 31 is an n-type substrate, the upper surfaces of the semiconductor substrate 31 may be doped with a material belonging to Group III to form the first and second dopant areas 32a and 32b.

Figure 3D:
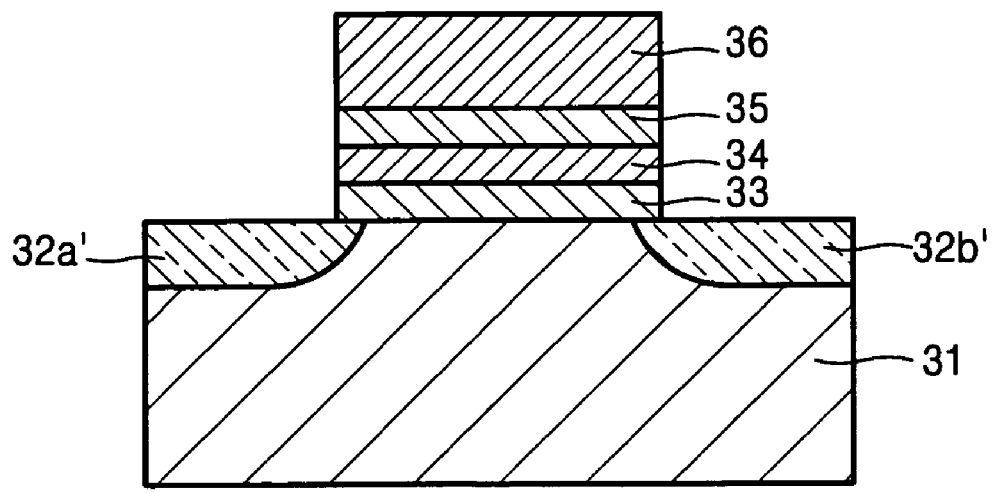

Referring to FIG. 3D, an annealing process is performed at a temperature between about 950° C. and 1000° C. If the annealing process is performed for several seconds to several minutes, first and second dopant areas 32a' and 32b' that are activated, i.e., crystallized, may be formed. The annealing process should be performed at a temperature of 900° C. or more to activate the first and second dopant areas 32a and 32b as described above.

As was explained above, if the temperature is more than or equal to a temperature at which a high-k material is re-crystallized, the high-k material is changed from an amorphous state into a crystal state. Thus, in the case of the conventional SONOS memory device, an undesired leakage current is generated in the blocking oxide layer 35 due to a grain boundary. Thus, there is a high possibility that charges trapped in a data storing area may be moved, and the retention characteristic of the device deteriorates.

According to embodiments of the invention, however, when a high-k insulating layer includes or consists of an Hf, Zr, Y, or lanthanum-family metal silicate, the high-k insulating layer remains in a stable amorphous state even during the high temperature annealing process. This prevents the deterioration of electric characteristics of the semiconductor memory device.

The characteristics of the high-k insulating layer according to some embodiments of the invention will be described in further detail below with reference to the drawings. In particular, a Zr silicate or Hf silicate insulating layer will be described.

Figure 4:
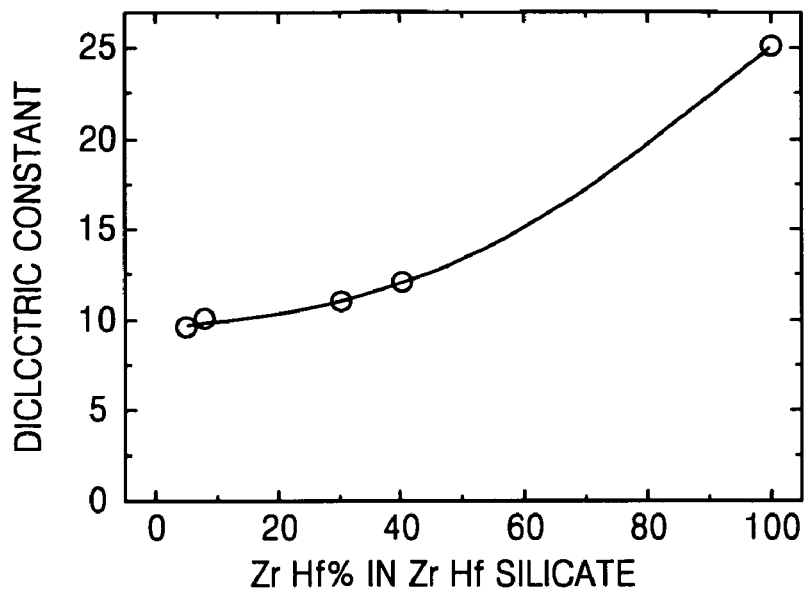
FIG. 4 is a graph illustrating a dielectric constant of a Zr or Hf silicate with respect to the atomic % of the Zr or Hf silicate.
Figure 5A:
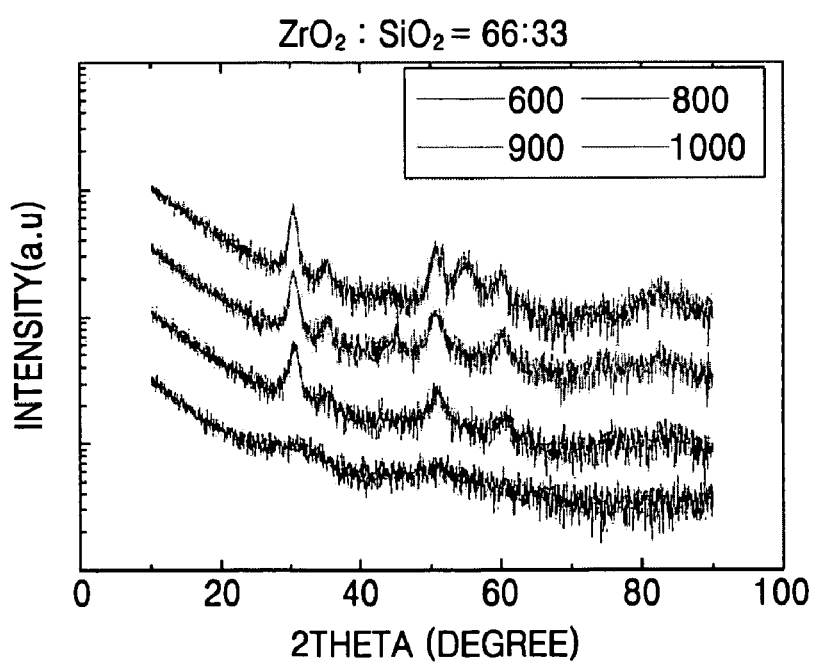
FIG. 5A is a graph illustrating an XRD of a compound of $ZrO_2$ and $SiO_2$ having an atomic % of 66:33.
Figures 5B, 5C:
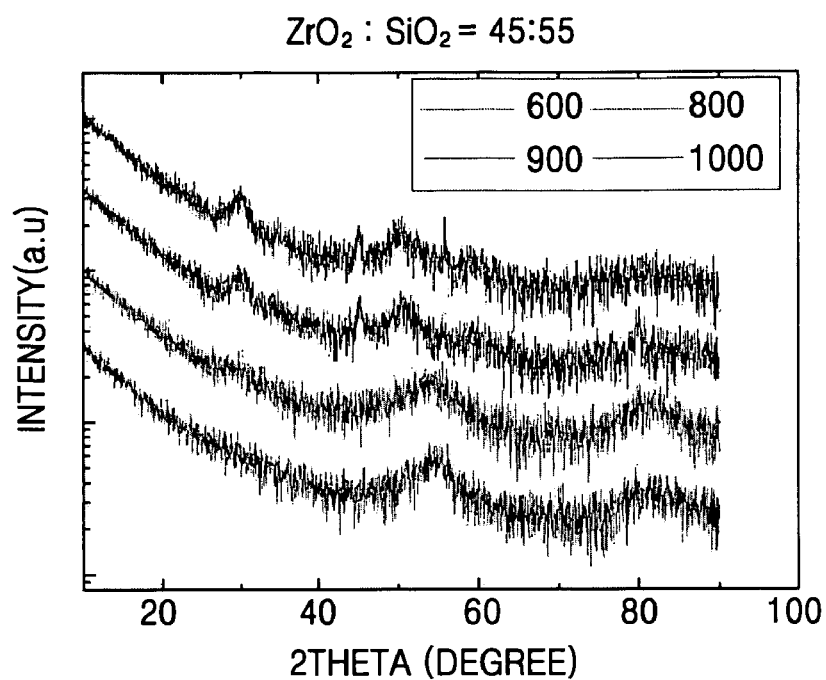
FIG. 5B is a graph illustrating an XRD of a compound of $ZrO_2$ and $SiO_2$ having an atomic % of 45:55.
FIG. 5C is a graph illustrating an XRD of a compound of $ZrO_2$ and $SiO_2$ having an atomic % of 17:83.

FIG. 4 is a graph illustrating a dielectric constant of a Zr silicate or Hf silicate with respect to the atomic % of Zr or Hf in the silicate. Referring to FIG. 4, the dielectric constant increases with an increase of atomic % of Zr or Hf with respect to Si. According to embodiments of the invention, if Zr or Hf is added to $SiO_2$, the atomic % of Zr or Hf may be 26% or less. In this case, the dielectric constant of a Zr silicate or a Hf silicate is slightly smaller than ten (10). Thus, the Zr or Hf silicate is a high-k material having a larger dielectric constant than a dielectric constant of $SiO_2$, which is about 3.9. As a result, according to embodiments of the invention, a dielectric constant k of a high-k material is within a range between 3.9 and 10 (3.9<k<10). FIGS. 5A through 5C are graphs illustrating an XRD with respect to an amount of Zr that is added to a silicate.

FIG. 5A is a graph illustrating an XRD measured after a specimen of $ZrO_2$ and $SiO_2$ having an atomic % of 66:33 is manufactured and annealed at temperatures of 600° C., 800° C., 900° C., and 1000° C. Referring to FIG. 5A, when the annealing temperature is high, a crystallization characteristic peak is observed. In particular, a ZrO crystal characteristic peak is observed at about 30°. Thus, it can be determined that the specimen has been crystallized.

FIG. 5B is a graph illustrating an XRD measured after a specimen of $ZrO_2$ and $SiO_2$ having an atomic % of 45:55 is manufactured and then annealed at temperatures of 600° C., 800° C., 900° C., and 1000° C. Referring to FIG. 5B, when the annealing temperature is high, a crystallization characteristic peak is observed. A ZrO crystal characteristic peak is observed from the specimen annealed at the temperatures of 900° C. and 1000° C. at about 30°. As a result, it can be determined that a high-k material has been crystallized in a process of manufacturing a semiconductor memory device in which annealing is performed at a temperature of 900° C. or more.

FIG. 5C is a graph illustrating an XRD measured after a specimen of $ZrO_2$ and $SiO_2$ having an atomic % of 17:83 is manufactured and then annealed at temperatures of 600° C., 800° C., 900° C., and 1000° C. Referring to FIG. 5C, it can be seen that the ZrO crystal characteristic peak at about 30° is not appreciably present, even at a high annealing temperature. The characteristic peak that is observed at about 57° is a characteristic peak of a Si substrate. Thus, a Zr silicate having an atomic % within the range taught by embodiments of the invention is not crystallized but remains amorphous when a high temperature annealing process is performed.

Figure 6A:
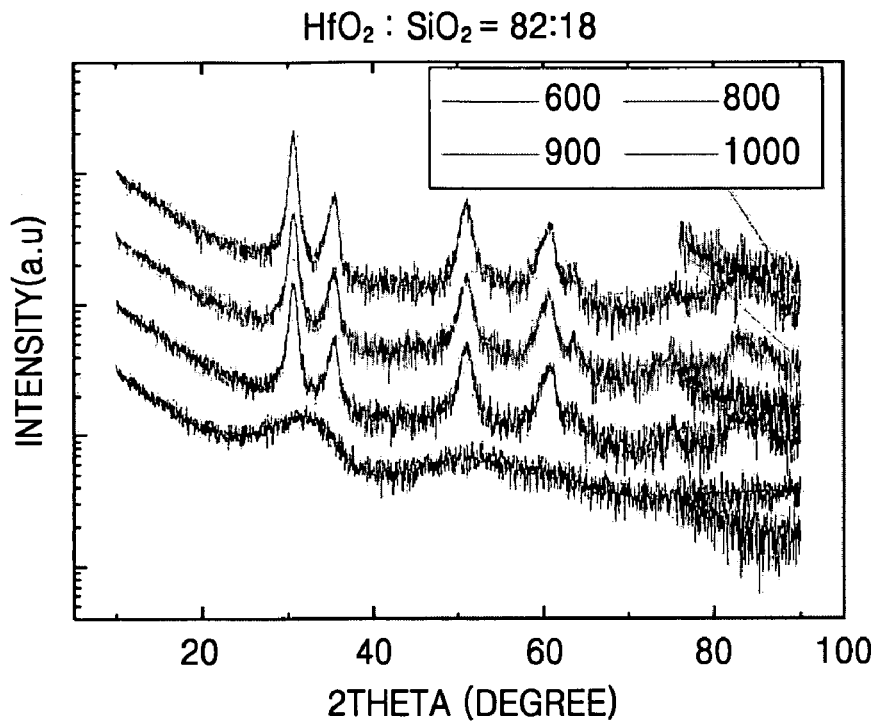
FIG. 6A is a graph illustrating an XRD of a compound of $HfO_2$ and $SiO_2$ having an atomic % of 82:18.
Figure 6B:
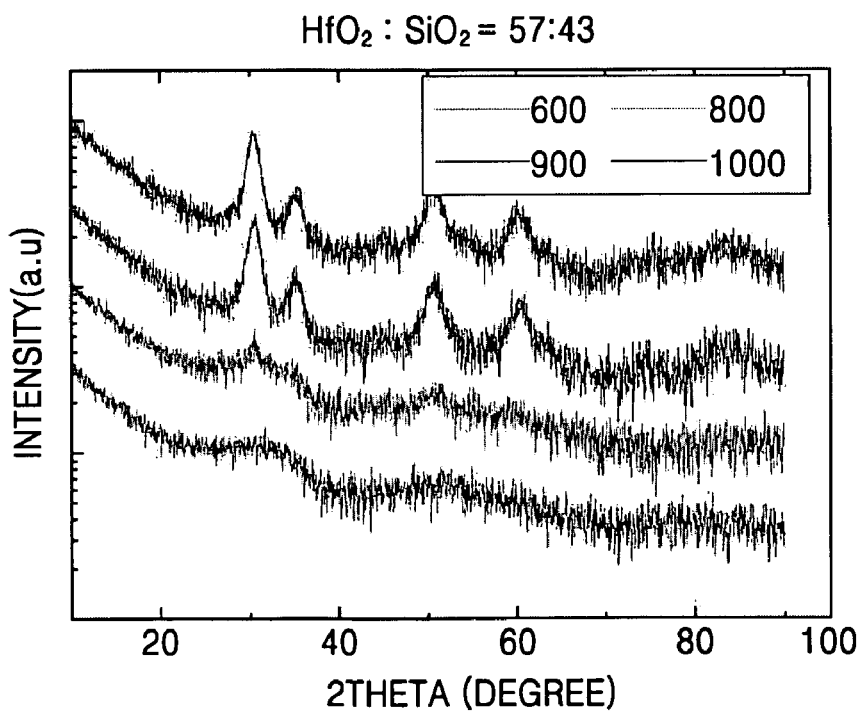
FIG. 6B is a graph illustrating an XRD of a compound of $HfO_2$ and $SiO_2$ having an atomic % of 57:43.
Figure 6C:
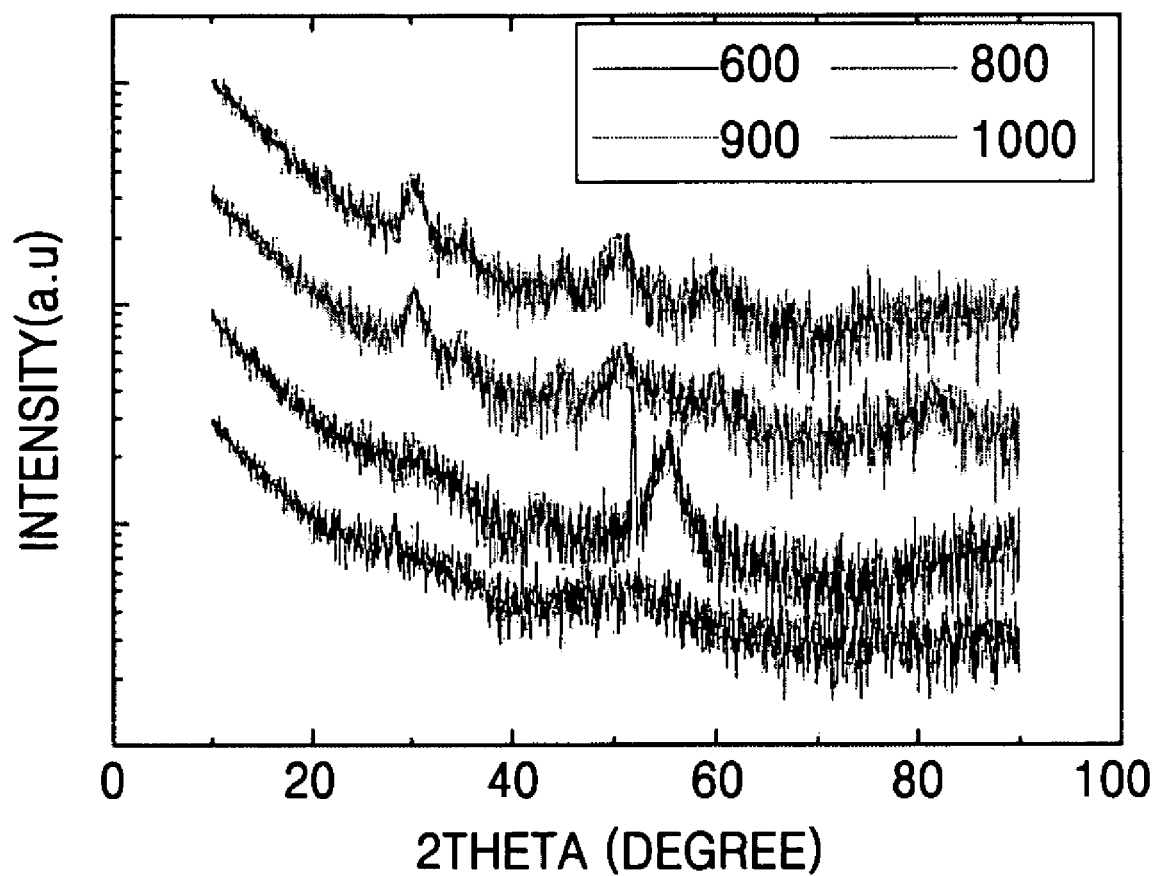
FIG. 6C is a graph illustrating an XRD of a compound of $HfO_2$ and $SiO_2$ having an atomic % of 26:73.

FIGS. 6A through 6C are graphs illustrating an XRD with respect to an atomic % of Hf that is added to a silicate.

FIG. 6A is a graph illustrating an XRD measured after a specimen of $HfO_2$ and $SiO_2$ having an atomic % of 82:18 is manufactured and then annealed at temperatures of 600° C., 800° C., 900° C., and 1000° C. Referring to FIG. 6A, when the annealing temperature is high, a crystallization characteristic peak for $HfO_2$ is clearly observed at about 30°. Thus, it can be determined that crystallization has been advanced.

FIG. 6B is a graph illustrating an XRD measured after a specimen of $HfO_2$ and $SiO_2$ having an atomic % of 57:43 is manufactured and then annealed at temperatures of 600° C., 800° C., 900° C., and 1000° C. Referring to FIG. 6B, a characteristic peak is not observed at the temperatures of 600° C. and 800° C. Thus, it can be determined that an amorphous state is maintained. However, an $HfO_2$ characteristic peak is observed at about 30° at the temperatures of 900° C. and 1000° C. Thus, it can be determined that crystallization has been advanced at these temperatures. As a result, a high-k material is crystallized in a process of manufacturing a semiconductor memory device in which annealing is performed at a temperature of 900° C. or more.

FIG. 6C is a graph illustrating an XRD measured after a specimen of $HfO_2$ and $SiO_2$ having an atomic % of 26:73 is manufactured and then annealed at temperatures of 600° C., 800° C., 900° C., and 1000° C. Referring to FIG. 6C, a characteristic peak is not observed at the temperatures of 600° C. and 800° C. Thus, it can be determined that an amorphous state is maintained. However, an $HfO_2$ characteristic peak is observed at about 30° at the temperatures of 900° C. and 1000° C. Thus, crystallization has been advanced at these temperatures. As a result, a high-k material is crystallized in a process of manufacturing a semiconductor memory device in which annealing is performed at a temperature of 900° C. or more.

Therefore, according to embodiments of the invention, a Zr or Hf silicate having a composition ratio less than or equal to 26 atomic % is thermally stable in a high temperature annealing process performed at a temperature of 900° C. or more. Thus, the Zr or Hf silicate is not crystallized but remains amorphous. Here, a dielectric constant of the Zr or Hf silicate is kept at "10" or less. Even in a case where a Y silicate or a lanthanum-family metal (Ln) silicate is used as a dielectric layer, these characteristics may be observed. In this case, a chemical formula "$((Hf, Zr, Y \text{ or } Ln)O_2)_x(SiO_2)_{1-x}$ ($0.03 \leq x \leq 0.26$)" is established. Also, Al instead of Si may be used in the chemical formula. In this case, a chemical formula "$((Hf, Zr, Y \text{ or } Ln)O_2)_x(Al2O3)_{1-x}$ ($0.03 \leq x \leq 0.26$)" may be expressed.

As described above, according to embodiments of the invention, a Zr or Hf silicate may be used as a high-k material in a flash memory device, an SONOS memory device, a floating gate type memory device, or a charge-trap memory. Thus, the crystallization of the high-k material (a ferroelectric layer) may be prevented to avoid an adverse influence on the characteristics of a semiconductor memory device due to a high temperature annealing process. A leakage current may be reduced, and a retention characteristic of the semiconductor memory may also be improved. Also, generally known processes for manufacturing a semiconductor device may be used, albeit modified in accordance with the inventive principles described above.

The invention may be practiced in many ways. What follows are exemplary, non-limiting descriptions of some embodiments of the invention.

According to some embodiments, a semiconductor memory device includes first and second dopant areas formed in a semiconductor substrate, an insulating layer formed on the semiconductor substrate so as to contact the first and second dopant areas, the insulating layer including an Hf silicate, a Zr silicate, a Y silicate, or a lanthanum-family metal silicate, and a gate electrode layer formed on the insulating layer.

The insulating layer may have composition of $((Hf, Zr, Y \text{ or } Ln)O_2)_x(SiO_2)_{1-x}$ ($0.03 \leq x \leq 0.26$) and a dielectric constant less than or equal to ten (10).

The insulating layer may include a tunneling oxide layer, a data storing layer, and a blocking oxide layer that are sequentially formed, wherein one of the tunneling oxide layer and the blocking oxide layer is a dielectric layer having a chemical formula "$((Hf, Zr, Y \text{ or } Zr)O_2)_x(SiO_2)_{1-x}$ ($0.03 \leq x \leq 0.26$)."

The insulating layer may include Al or N.

According to some embodiments, a method of manufacturing a semiconductor memory device includes forming an insulating layer including an Hf silicate, a Zr silicate, a Y silicate, or a lanthanum-family metal silicate on a semiconductor substrate, forming a gate electrode layer on the insulating layer, removing both sides of each of the insulating layer and the gate electrode layer to form a gate area and to expose upper surfaces of the semiconductor substrate on both sides of the gate area; doping the exposed upper surfaces of the semiconductor substrate with a dopant to form first and second dopant areas, and performing annealing to activate the first and second dopant areas.

The insulating layer may be formed by sequentially depositing a tunneling oxide layer, a charge-trap layer, and a blocking oxide layer on the semiconductor substrate. Here, the tunneling oxide layer or the blocking oxide layer may be a dielectric layer having a chemical formula "$((Hf, Zr, Y \text{ or } Zr)O_2)_x(SiO_2)_{1-x}(0.03 \leq x \leq 0.26)$."

The insulating layer may have a dielectric constant less than or equal to ten (10), and the insulating layer may include Al or N.

According to some embodiments of the invention, a semiconductor memory device includes first and second dopant areas formed on a semiconductor substrate, an insulating layer formed on the semiconductor substrate so as to contact the first and second dopant areas and having a composition of $((Hf, Zr, Y \text{ or } Zr)O_2)_x(SiO_2)_{1-x}(0.03 \leq x \leq 0.26)$, and a gate electrode layer formed on the insulating layer.

The preferred embodiments described above should be construed as exemplary and illustrative of the inventive principles contained in the preferred embodiments rather than as limiting the scope of the invention. For example, although the preferred embodiments were described above in the context of a SONOS memory device, the inventive principles contained in those preferred embodiments may be applied to other memory devices that use high-k materials such as a flash memory device, a floating gate type memory device, or a charge-trap memory. Therefore, the scope of the invention is not defined not by the detailed description of the invention but by the appended claims.

Furthermore, the written description contains one or more references to particular embodiments of the invention, each particular embodiment serving to illustrating one or more inventive principles taught by the invention. It should be evident that all embodiments contain at least one of the inventive principles described above and that some embodiments may contain more than one of the illustrated inventive principles.

The invention claimed is:

1. A semiconductor memory device comprising:
a first dopant area and a second dopant area, the first dopant area and the second dopant areas disposed in a semiconductor substrate;
an insulating layer disposed in contact with the first dopant area and the second dopant area, the insulating layer including an amorphous material comprising at least one of an Hf silicate, a Zr silicate, a Y silicate, and a Ln silicate; and
a gate electrode layer disposed on the insulating layer,
wherein the insulating layer comprises:
a tunneling oxide layer disposed in contact with the first dopant area and the second dopant area;
a data storing layer disposed on the tunneling oxide layer; and
a blocking oxide layer disposed on the data storing layer,
wherein the tunneling oxide layer consists of the amorphous material having the chemical formula $((Hf, Zr, Y \text{ or } Ln)O_2)_x(SiO_2)_{1-x}$, where $(0.03 \leq x \leq 0.26)$.

2. The semiconductor memory device of claim 1, the amorphous material having a dielectric constant that is greater than 3.9 and less than or equal to 10.

3. The semiconductor memory device of claim 1, the insulating layer comprising one of Al and N.

4. The semiconductor memory device of claim 1, the insulating layer comprising the Hf silicate.

5. The semiconductor memory device of claim 1, the insulating layer comprising the Zr silicate.

6. The semiconductor memory device of claim 1, the insulating layer comprising the Y silicate.

7. The semiconductor memory device of claim 1, the insulating layer comprising the Ln silicate.

* * * * *

UNITED STATES PATENT AND TRADEMARK OFFICE
CERTIFICATE OF CORRECTION

PATENT NO. : 7,456,468 B2 Page 1 of 1
APPLICATION NO. : 11/335431
DATED : November 25, 2008
INVENTOR(S) : Sang-Hun Jeon et al.

It is certified that error appears in the above-identified patent and that said Letters Patent is hereby corrected as shown below:

Column 4, line 2, the word "Th" should read -- Tb --;

Column 7, line 23, the phrase "$((Hf, Zr, Y \text{ or } Zr)O_2)_x(SiO_2)_{1-x}(0.03 \leq x \leq 0.26)$" should read -- $((Hf, Zr, Y \text{ or } Ln)O_2)_x(Al_2O_3)_{1-x}(0.03 \leq x \leq 0.26)$ --.

Signed and Sealed this

Third Day of March, 2009

JOHN DOLL
*Acting Director of the United States Patent and Trademark Office*